United States Patent
Wu et al.

(10) Patent No.: US 9,935,113 B2
(45) Date of Patent: Apr. 3, 2018

(54) NON-VOLATILE MEMORY AND METHOD FOR PROGRAMMING AND READING A MEMORY ARRAY HAVING THE SAME

(71) Applicant: eMemory Technology Inc., Hsin-Chu (TW)

(72) Inventors: Meng-Yi Wu, Hsinchu County (TW); Hsin-Ming Chen, Hsinchu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/604,672

(22) Filed: May 25, 2017

(65) Prior Publication Data
US 2017/0345828 A1    Nov. 30, 2017

Related U.S. Application Data

(60) Provisional application No. 62/341,105, filed on May 25, 2016.

(51) Int. Cl.
| | |
|---|---|
| *H01L 27/112* | (2006.01) |
| *H01L 29/78* | (2006.01) |
| *H01L 23/525* | (2006.01) |
| *H01L 29/06* | (2006.01) |
| *H01L 29/08* | (2006.01) |

(Continued)

(52) U.S. Cl.
CPC ...... *H01L 27/11206* (2013.01); *G11C 17/165* (2013.01); *G11C 17/18* (2013.01); *H01L 23/5252* (2013.01); *H01L 29/0649* (2013.01); *H01L 29/0847* (2013.01); *H01L 29/1095* (2013.01); *H01L 29/165* (2013.01); *H01L 29/1608* (2013.01); *H01L 29/42376* (2013.01); *H01L 29/7848* (2013.01); *H01L 29/7851* (2013.01)

(58) Field of Classification Search
None
See application file for complete search history.

(56) References Cited

U.S. PATENT DOCUMENTS

| | | |
|---|---|---|
| 9,171,752 B1 | 10/2015 | Wu |
| 9,536,991 B1 | 1/2017 | Zang |

(Continued)

FOREIGN PATENT DOCUMENTS

| | | |
|---|---|---|
| TW | 200943305 A1 | 10/2009 |
| TW | 201203253 A1 | 1/2012 |
| TW | 201505152 A | 2/2015 |

*Primary Examiner* — James G Norman
(74) *Attorney, Agent, or Firm* — Winston Hsu

(57) ABSTRACT

A non-volatile memory (NVM) includes a fin structure, a first fin field effect transistor (FinFET), a second FinFET, an antifuse structure, a third FinFET, and a fourth FinFET. The antifuse structure is formed on the fin structure and has a sharing gate, a single diffusion break (SDB) isolation structure, a first source/drain region, and a second source/drain region. The SDB isolation structure isolates the first source/drain region and the second source/drain region. The first FinFET, the second FinFET and the first antifuse element compose a first one time programmable (OTP) memory cell, and the third FinFET, the fourth FinFET and the second antifuse element compose a second OTP memory cell. The first OTP memory cell and the second OTP memory cell share the antifuse structure.

19 Claims, 7 Drawing Sheets

(51) Int. Cl.
*H01L 29/10* (2006.01)
*H01L 29/165* (2006.01)
*H01L 29/16* (2006.01)
*H01L 29/423* (2006.01)
*G11C 17/16* (2006.01)
*G11C 17/18* (2006.01)

(56) References Cited

U.S. PATENT DOCUMENTS

| | | |
|---|---|---|
| 9,589,970 B1 | 3/2017 | Tseng |
| 2010/0232203 A1 | 9/2010 | Chung |
| 2014/0117454 A1* | 5/2014 | Liu .................. H01L 29/6681 257/368 |
| 2016/0141295 A1 | 5/2016 | Wu |
| 2017/0076757 A1 | 3/2017 | Wu |
| 2017/0117058 A1 | 4/2017 | Schmitt |

\* cited by examiner

| Program Operation Bias | GA (AF) | G1(WL) or G4(WL2) | G2 and G3 (FL) | BL |
|---|---|---|---|---|
| Selected Row Selected Column | V3 (3.6~5.5V) | V1 (0.6~1.4V) | V2 (1.2~2.2V) | Vg (0V) |
| Unselected Row Selected Column | V3 (3.6~5.5V) | Vg (0V) | V2 (1.2~2.2V) | Vg (0V) |
| Selected Row Unselected Column | V3 (3.6~5.5V) | V1 (0.6~1.4V) | V2 (1.2~2.2V) | V1 (0.6~1.4V) |
| Unselected Row Unselected Column | V3 (3.6~5.5V) | Vg (0V) | V2 (1.2~2.2V) | V1 (0.6~1.4V) |

FIG. 7

NON-VOLATILE MEMORY AND METHOD FOR PROGRAMMING AND READING A MEMORY ARRAY HAVING THE SAME

CROSS REFERENCE TO RELATED APPLICATIONS

This application claims the benefit of U.S. Provisional Application No. 62/341,105, filed on May 25, 2016, the contents of which are incorporated herein in their entirety.

BACKGROUND OF THE INVENTION

1. Field of the Invention

The present invention relates to a non-volatile memory (NVM), and more particularly, to a non-volatile memory having one time programmable (OTP) memory cells.

2. Description of the Prior Art

As is well known, a non-volatile memory is able to continuously retain data after the supplied power is interrupted. Generally, after the non-volatile memory leaves the factory, the user may program the non-volatile memory in order to record data into the non-volatile memory.

According to the programming times limit, the non-volatile memories may be classified into a multi-time programmable (MTP) memory, a one time programmable (OTP) and a mask read only memory (Mask ROM). Generally, the MTP memory may be programmed many times, and the stored data of the MTP memory may be modified many times. On the contrary, the OTP memory may be programmed once. After the OTP memory is programmed, the stored data fails to be modified. Moreover, after the Mask ROM leaves the factory, all stored data has been recorded therein. The user is only able to read the stored data from the Mask ROM, but is unable to program the Mask ROM.

Moreover, depending on the characteristics, the OTP memories may be classified into two types, i.e. a fuse-type OTP memory and an antifuse-type OTP memory. Before a memory cell of the fuse-type OTP memory is programmed, the memory cell has a low-resistance storing state. After the memory cell of the fuse-type OTP memory is programmed, the memory cell has a high-resistance storing state. On the other hand, the memory cell of the antifuse-type OTP memory has the high-resistance storing state before being programmed, and the memory cell of the antifuse-type OTP memory has the low-resistance storing state after being programmed.

Generally, an OTP memory may comprise a plurality of OTP memory cells, and a shallow trench isolation (STI) structure may be used to isolate two adjacent OTP memory cells. However, the OTP memory may have too many STI structures that occupy the layout area of the OTP memory. Accordingly, the effective layout area for the OTP memory cells may be shrunk.

SUMMARY OF THE INVENTION

According to an exemplary embodiment, a non-volatile memory (NVM) is disclosed. The NVM comprises a fin structure, a first fin field effect transistor (FinFET), a second FinFET, an antifuse structure, a third FinFET, and a fourth FinFET. The first FinFET is formed on the fin structure and has a first gate, a first source region, and a first drain region. The second FinFET is formed on the fin structure and has a second gate, a second drain region, and a second source region coupled to the first drain region. The antifuse structure is formed on the fin structure and has a sharing gate, a single diffusion break (SDB) isolation structure, a first source/drain region, and a second source/drain region. The SDB isolation structure is formed between the first source/drain region and the second source/drain region. A top surface of the SDB isolation structure is covered by the sharing gate. The first source/drain region is coupled to the second drain region. The third FinFET is formed on the fin structure and has a third gate, a third source region, and a third drain region coupled to the second source/drain region. The fourth FinFET is formed on the fin structure and has a fourth gate, a fourth source region, and a fourth drain region coupled to the third source region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 7 is a diagram showing a table listing related voltages for programming the memory array shown in FIG. 6.

DETAILED DESCRIPTION

Figure 1:
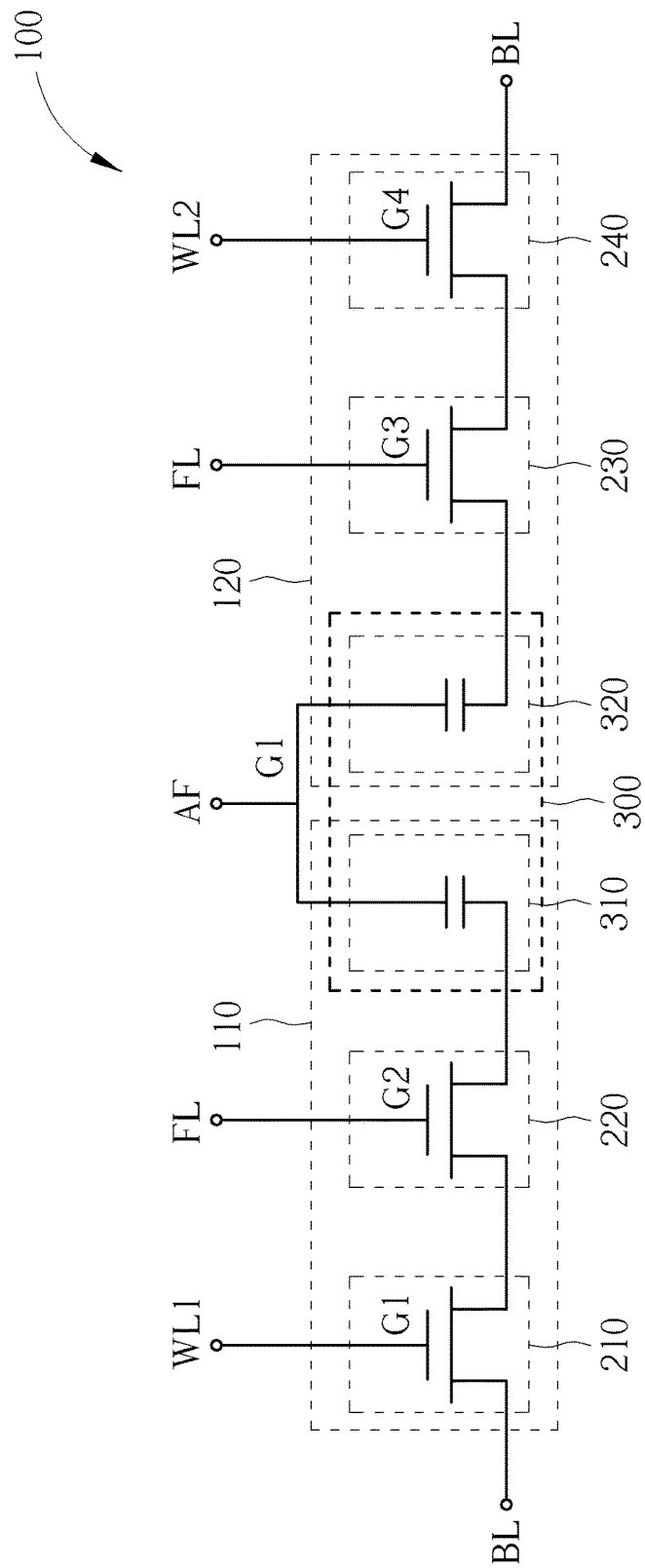
FIG. 1 is a diagram showing an equivalent circuit of a non-volatile memory according to a first embodiment of the present invention.

Please refer to FIG. 1. FIG. 1 is a diagram showing an equivalent circuit of a non-volatile memory (NVM) 100 according to a first embodiment of the present invention. The NVM 100 comprises a first fin field effect transistor (FinFET) 210, a second FinFET 220, an antifuse structure 300, a third FinFET 230, and a fourth FinFET 240. A first gate G1 of the first FinFET 210 is coupled to a first word line WL1, a second gate G2 of the second FinFET 220 and a third gate G3 of the third FinFET 230 are coupled to a following line FL, a fourth gate G4 of the fourth FinFET 240 is coupled to a second word line WL2, and a sharing gate GA of the antifuse structure 300 is coupled to an antifuse line AF. The first FinFET 210 and the fourth FinFET 240 are coupled to a bit line BL. The antifuse structure 300 may form a first antifuse element 310 of a first one time programmable (OTP) memory cell 110 and a second antifuse element 320 of a second OTP memory cell 120. In the embodiment, the first OTP memory cell 110 comprises the first FinFET 210, the second FinFET 220 and the first antifuse element 310, and the second OTP memory cell 120 comprises the third FinFET 230, the fourth FinFET 240 and the second antifuse element 320. It could be noted that each of the antifuse elements 310 and 320 may be a varactor, a capacitor or a half transistor.

When programming the first OTP memory cell 110, the first antifuse element 310 would be ruptured and behave as a resistor, such that data of logic "0" would be written into the first OTP memory cell 110. Similarly, when programming the second OTP memory cell 120, the second antifuse element 320 would be ruptured and behave as a resistor, such that data of logic "0" would be written into the second OTP memory cell 120.

Figure 2:
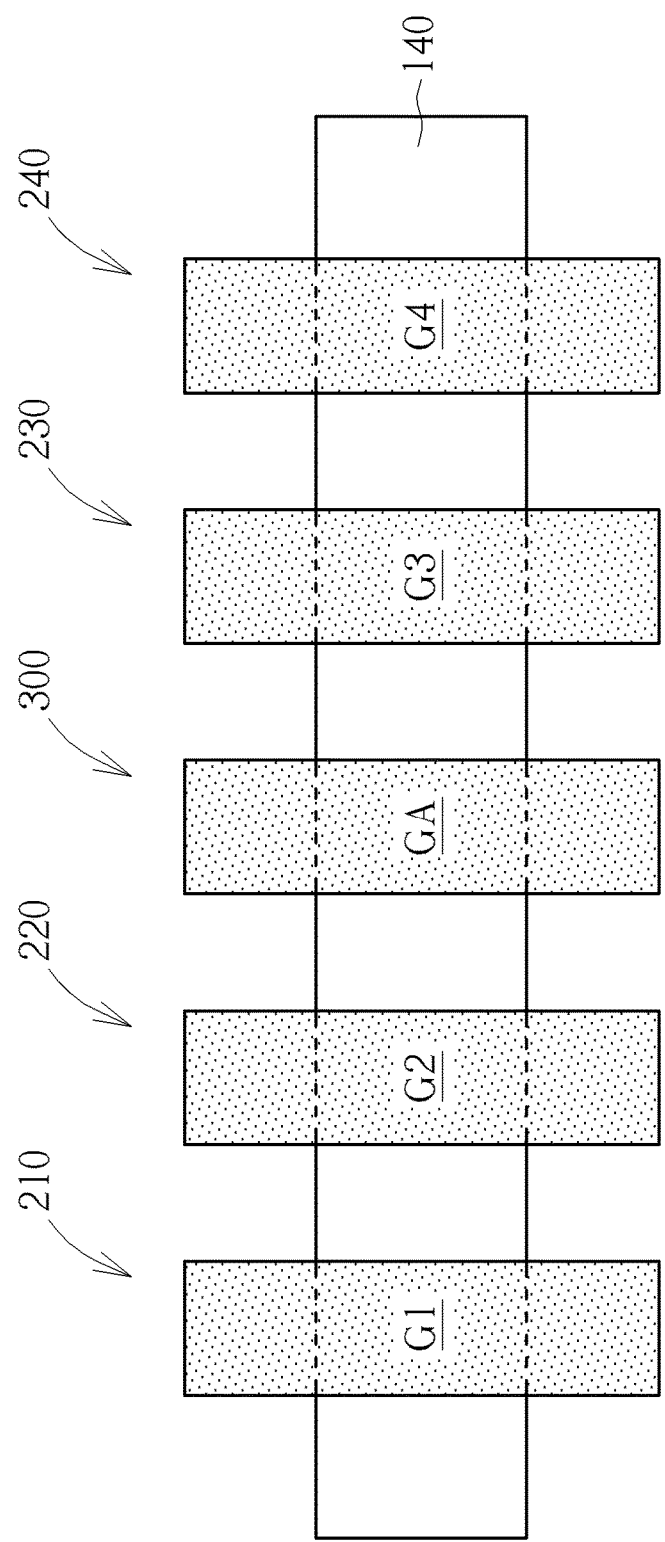
FIG. 2 is a diagram showing a layout of gates, a sharing gate and a fin structure of the non-volatile memory shown in FIG. 1.

Please refer to FIG. 2. FIG. 2 is a diagram showing a layout of the gates G1 to G4, the sharing gate GA and a fin structure 140 of the non-volatile memory 100 shown in FIG. 1. The gates G1 to G4 and the sharing gate GA are formed on the fin structure 140.

Figure 3:
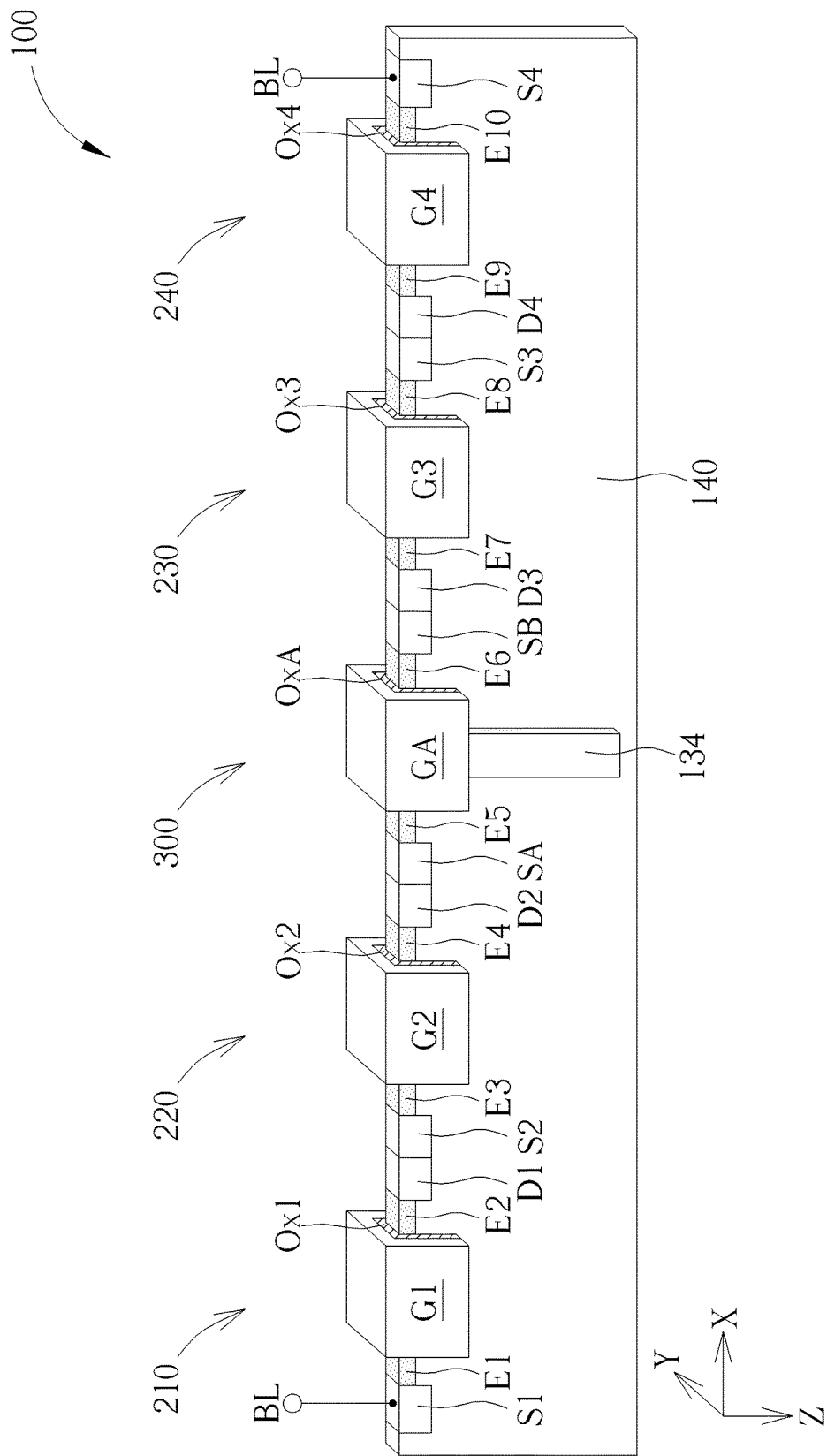
FIG. 3 is a three-dimensional diagram showing a structure of the non-volatile memory shown in FIG. 1.
Figure 4:
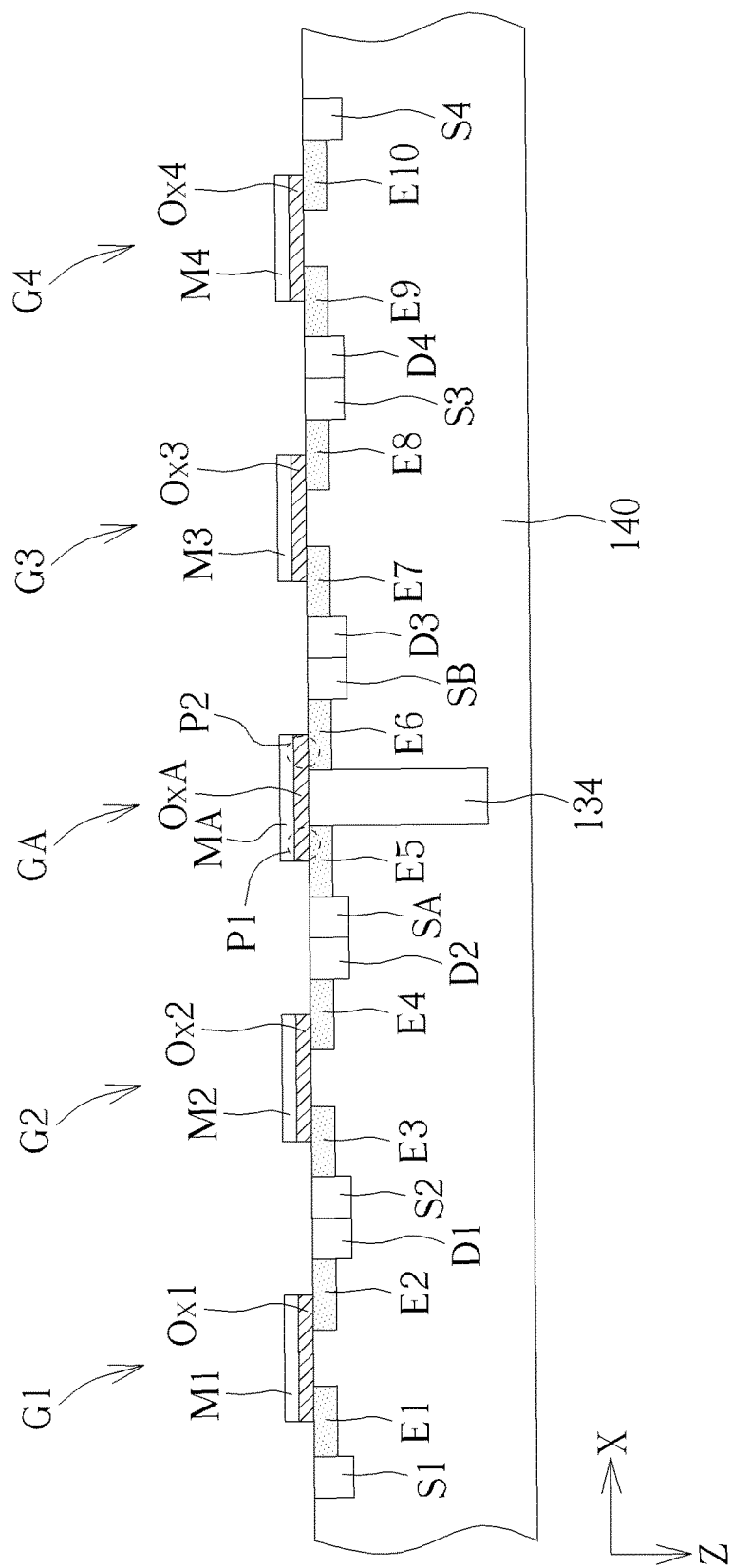
FIG. 4 is a component cross-sectional view of the non-volatile memory shown in FIG. 1.

Please refer to FIGS. 3 and 4. FIG. 3 is a three-dimensional diagram showing a structure of the non-volatile memory 100 shown in FIG. 1. FIG. 4 is a component cross-sectional view of the non-volatile memory 100 shown in FIG. 1. FIGS. 3 and 4 are illustrated by using Cartesian coordinate system that has three axes X, Y and Z. The first FinFET 210, the second FinFET 220, the antifuse structure 300, the third FinFET 230 and the fourth FinFET 240 are formed on the fin structure 140. The first FinFET 210 further has a first source region S1 and a first drain region D1. The first source region S1 is coupled to the bit line BL. The second FinFET further has a second drain region D2, and a second source region S2 coupled to the first drain region D1. The antifuse structure 300 further has a single diffusion break (SDB) isolation structure 134, a first source/drain region SA coupled to the second drain region D2, and a second source/drain region SB. The SDB isolation structure 134 is formed between the first source/drain region SA and the second source/drain region SB to isolate the first source/drain region SA and the second source/drain region SB. The SDB isolation structure 134 may be formed of silicon oxide. The third FinFET 230 further has a third source region S3, and a third drain region D3 coupled to the second source/drain region SB. The fourth FinFET 240 further has a fourth source region S4 coupled to the bit line BL, and a fourth drain region D4 coupled to the third source region S3. The fin structure 140 may be a P well over a silicon substrate, and the source regions S1 to S4, the drain regions D1 to D4 and the source/drain regions SA and SB may be elevated and formed on the fin structure 140 by an epitaxial silicon phosphorous (SiP) or silicon carbide (SiC) process.

In addition, the first gate G1 has a metal layer M1 and a gate oxide layer Ox1 formed between the metal layer M1 and the fin structure 140. The second gate G2 has a metal layer M2 and a gate oxide layer Ox2 formed between the metal layer M2 and the fin structure 140. The sharing gate GA may be a poly over diffusion edge (PODE) formed by performing FinFET processes (i.e. the processes of manufacturing the non-volatile memory 100) and may be used as a gate of an antifuse. The sharing gate GA has a metal layer MA and a gate oxide layer OxA formed between the metal layer MA and the fin structure 140. The third gate G3 has a metal layer M3 and a gate oxide layer Ox3 formed between the metal layer M3 and the fin structure 140. The fourth gate G4 has a metal layer M4 and a gate oxide layer Ox4 formed between the metal layer M4 and the fin structure 140. The thicknesses of the metal layers M1, M2, M3, M4 and MA may be the same, and thicknesses of the gate oxide layers Ox1, Ox2, Ox3, Ox4 and OxA may be the same.

Please refer to FIG. 1 with reference of FIG. 4. When the OTP memory cell 110 is programmed, a portion P1 of the gate oxide layer OxA is ruptured (i.e., the first antifuse element 310 is ruptured). When the OTP memory cell 120 is programmed, a portion P2 of the gate oxide layer OxA is ruptured (i.e., the second antifuse element 320 is ruptured).

Figure 5:
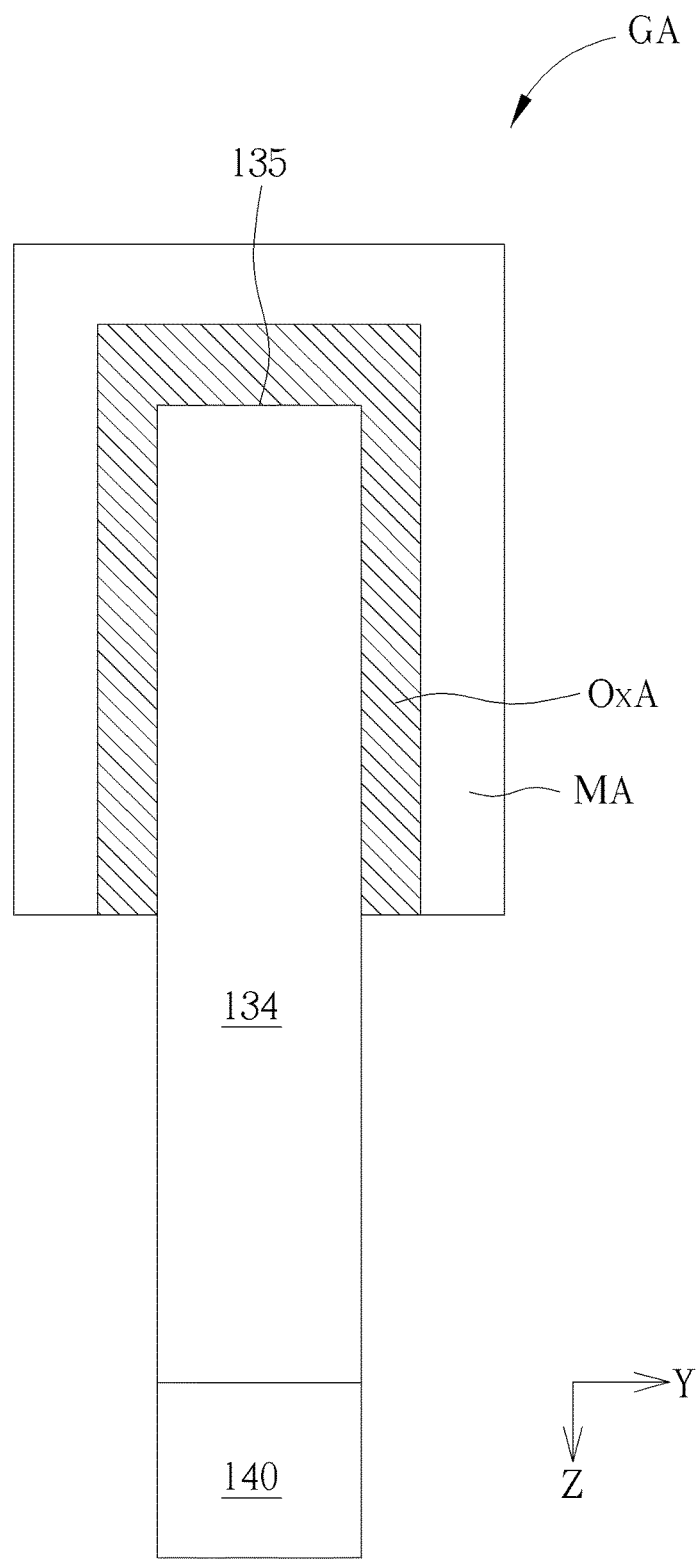
FIG. 5 is a component cross-sectional view of the sharing gate GA and a single diffusion break (SDB) isolation structure of the non-volatile memory shown in FIG. 1.

Please refer to FIG. 5 with reference of FIGS. 3 and 4. FIG. 5 is a component cross-sectional view of the sharing gate GA and a single diffusion break (SDB) isolation structure 134 of the non-volatile memory 100 shown in FIG. 1. The sharing gate GA has a U shape to overlap three lateral sides of the SDB isolation structure 134. Therefore, a top surface 135 of the SDB isolation structure 134 is covered by the sharing gate GA. Similarly, each of the first gate G1, the second gate G2, the third gate G3 and the fourth gate G4 has a U shape to overlap three lateral sides of the fin structure 140.

Please refer to FIGS. 3 and 4 again. In another embodiment of the present invention, the first FinFET 210 may further have a first source/drain extension area E1 and a second source/drain extension area E2. The first source/drain extension area E1 is coupled to the first source region S1 and partially covered by the first gate G1. The second source/drain extension area E2 is coupled to the first drain region D1 and partially covered by the first gate G1. The second FinFET 220 may further have a third source/drain extension area E3 and a fourth source/drain extension area E4. The third source/drain extension area E3 is coupled to the second source region S2 and partially covered by the second gate G2. The fourth source/drain extension area E4 is coupled to the second drain region D2 and partially covered by the second gate G2. The antifuse structure 300 may further have a fifth source/drain extension area E5 and a sixth source/drain extension area E6. The fifth source/drain extension area E5 is coupled to the first source/drain region SA and partially covered by the sharing gate GA. The sixth source/drain extension area E6 is coupled to the second source/drain region SB and partially covered by the sharing gate GA. The third FinFET 230 may further have a seventh source/drain extension area E7 and an eighth source/drain extension area E8. The seventh source/drain extension area E7 is coupled to the third drain region D3 and partially covered by the third gate G3. The eighth source/drain extension area E8 is coupled to the third source region S3 and partially covered by the third gate G3. The fourth FinFET 240 may further have a ninth source/drain extension area E9 and a tenth source/drain extension area E10. The ninth source/drain extension area E9 is coupled to the drain region D4 and partially covered by the fourth gate G4. The tenth source/drain extension area E10 is coupled to the fourth source region S4 and partially covered by the fourth gate G4. In another embodiment of the present invention, the third source/drain extension area E3, the fourth source/drain extension area E4, the seventh source/drain extension area E7 and the eighth source/drain extension area E8 could be omitted.

According to the above arrangement, since the antifuse structure 300 forms the first antifuse element 310 of the first OTP memory cell 110 and the second antifuse element 320 of the second OTP memory cell 120, the two OTP memory cells 110 and 120 share the antifuse structure 300. Therefore, a shallow trench isolation (STI) structure between the two OTP memory cells 110 and 120 could be omitted. As a result, the effective layout area for the OTP memory cells may be increased.

Figure 6:
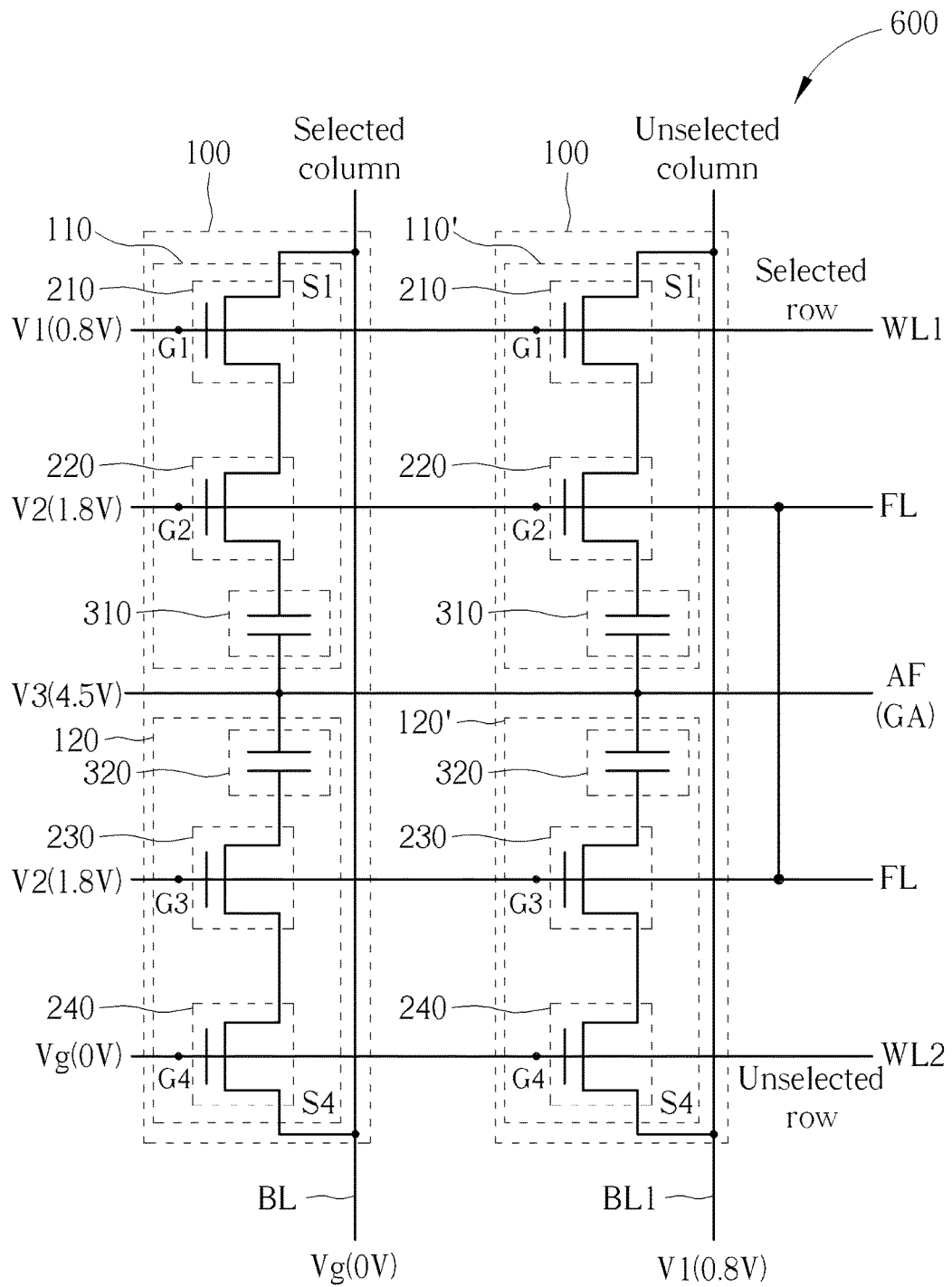
FIG. 6 is a diagram showing a method for programming a memory array comprising the OTP memory cells of the present invention.

Please refer to FIGS. 6 and 7. FIG. 6 is a diagram showing a method for programming a memory array 600 comprising the OTP memory cells of the present invention. FIG. 7 is a diagram showing a table listing related voltages for programming the memory array shown in FIG. 6. For the sake of simplicity, only two non-volatile memories (NVMs) 100 are illustrated in FIG. 6. However, the memory array 600 may comprise a plurality of NVMs 100 arranged in a matrix having a plurality of rows and a plurality of columns, and each OTP memory cell of the NVMs 100 is located at a corresponding row and a corresponding column. Each of the NVMs 100 has two OTP memory cells. For example, as shown in FIG. 6, the left NVM 100 has two OTP memory cells 110 and 120, and the right NVM 100 has two OTP memory cells 110' and 120'. In the embodiment, it is assumed that the upper left OTP memory cell 110 is selected to be programmed. When programming the selected OTP memory cell 110, a first voltage V1 (such as 0.8V) is provided to the first gates G1 at a selected row via the first word line WL1, a second voltage V2 (such as 1.8V) is provided to all second gates G2 and all third gates G3 of the memory array 600 via the following line FL, a third voltage V3 (such as 4.5V) is provided to all sharing gates GA of the memory array 600 via the antifuse line AF. Besides, a ground voltage Vg (such as 0V) is provided to the first source region S1 and the fourth source region S4 of the NVM 100 at a selected column via the bit line BL. The third voltage V3 is greater than the first voltage V1 and the second voltage V2, and the first voltage V1 and the second voltage V2 are greater than the ground voltage Vg. The first voltage V1 may range from 0.6 volts to 1.4 volts, the second voltage V2 may range from 1.2 volts to 2.2 volts, and the third voltage V3 may range from 3.6 volts to 5.5 volts.

According to the above programming operations, the first antifuse element 310 of the selected OTP memory cell 110 can be ruptured to be a resistor by the third voltage V3, such that data of logic "0" is written into the selected OTP memory cell 110 at the selected row and the selected column. On the other hand, for writing data of logic "1" into the selected OTP memory cell 110 at the selected row and column, the voltage level at the sharing gate GA can be set at 0V.

In addition, for unselected OTP memory cells 120 and 120' at an unselected row, the ground voltage Vg is provided to the fourth gates G4 of the unselected OTP memory cells 120 and 120'. For the unselected OTP memory cells 110' and 120' at an unselected column, the first voltage V1 is provided to the first source region S1 of the unselected OTP memory cell 110' and the fourth source region S4 of the unselected OTP memory cell 120' via the bit line BL1. Therefore, the unselected OTP memory cells 110', 120 and 120' can be set in a program inhibition status.

When reading data of the selected memory cell 100, the bit line BL is at the ground voltage Vg, a device voltage VDD is provided to the first gate G1 and the second gate G2 via the word line WL1 and the following line FL, and the second voltage V2 or the device voltage VDD is provided to the sharing gate GA via the antifuse line AF. Moreover, if any OTP memory cell 110, 100', 120 or 120' in a read inhibition status, a corresponding word line WL1 or WL2 coupled to the memory cell may be applied by the ground voltage Vg.

In the previous embodiments, the first gate G1 of the first FinFET 210 and the fourth gate G4 of the fourth FinFET 240 are coupled to two different word lines WL1 and WL2. However, the present invention is not limited thereto. In another embodiment of the present invention, the first gate G1 of the first FinFET 210 and the fourth gate G4 of the fourth FinFET 240 may be coupled to a same word line, and the two OTP memory cells of each NVM 100 only record a single bit after the NVM 100 is programmed. For example, both of the first gate G1 and the fourth gate G4 of a single NVM 100 may be coupled to the word line WL1, and the two OTP memory cells of the single NVM 100 would store one bit after the single NVM 100 is programmed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory, comprising:
   a fin structure;
   a first fin field effect transistor (FinFET), formed on the fin structure and having a first gate, a first source region, and a first drain region;
   a second FinFET, formed on the fin structure and having a second gate, a second drain region, and a second source region coupled to the first drain region;
   an antifuse structure, formed on the fin structure and having a sharing gate, a single diffusion break (SDB) isolation structure, a first source/drain region, and a second source/drain region, wherein the SDB isolation structure is formed between the first source/drain region and the second source/drain region, a top surface of the SDB isolation structure is covered by the sharing gate, and the first source/drain region is coupled to the second drain region;
   a third FinFET, formed on the fin structure and having a third gate, a third source region, and a third drain region coupled to the second source/drain region; and
   a fourth FinFET, formed on the fin structure and having a fourth gate, a fourth source region, and a fourth drain region coupled to the third source region.

2. The non-volatile memory of claim 1, wherein the antifuse structure forms a first antifuse element and a second antifuse element.

3. The non-volatile memory of claim 2, wherein the first FinFET, the second FinFET and the first antifuse element compose a first one time programmable (OTP) memory cell, and the third FinFET, the fourth FinFET and the second antifuse element compose a second OTP memory cell.

4. The non-volatile memory of claim 1, wherein the SDB isolation structure isolates the first source/drain region and the second source/drain region.

5. The non-volatile memory of claim 1, wherein the first FinFET further comprises:
   a first source/drain extension area, coupled to the first source region and partially covered by the first gate; and
   a second source/drain extension area, coupled to the first drain region and partially covered by the first gate;
the antifuse structure further comprises:
   a fifth source/drain extension area, coupled to the first source/drain region and partially covered by the sharing gate; and
   a sixth source/drain extension area, coupled to the second source/drain region and partially covered by the sharing gate; and
the fourth FinFET further comprises:
   a ninth source/drain extension area, coupled to the fourth drain region and partially covered by the fourth gate; and
   a tenth source/drain extension area, coupled to the fourth source region and partially covered by the fourth gate.

6. The non-volatile memory of claim 5, wherein the second FinFET further comprises:

a third source/drain extension area, coupled to the second source region and partially covered by the second gate; and a fourth source/drain extension area, coupled to the second drain region and partially covered by the second gate; and wherein the third FinFET further comprises:

a seventh source/drain extension area, coupled to the third drain region and partially covered by the third gate; and an eighth source/drain extension area, coupled to the third source region and partially covered by the third gate.

7. The non-volatile memory of claim 1, wherein the second gate is coupled to the third gate.

8. The non-volatile memory of claim 1, wherein the first source region is coupled to the fourth source region.

9. The non-volatile memory of claim 1, wherein the first gate is coupled to the fourth gate.

10. The non-volatile memory of claim 1, wherein the fin structure is a P well over a silicon substrate, and all source regions, all drain regions and all source/drain regions are formed by an epitaxial silicon phosphorous (SiP) or silicon carbide (SiC) process.

11. The non-volatile memory of claim 1, wherein the SDB isolation structure is formed of silicon oxide.

12. The non-volatile memory of claim 1, wherein each of the first gate, the second gate, the third gate and the fourth gate has a U shape to overlap three lateral sides of the fin structure.

13. The non-volatile memory of claim 1, wherein the sharing gate has a U shape to overlap three lateral sides of the SDB isolation structure.

14. The non-volatile memory of claim 1, wherein each of the first gate, the second gate, the third gate, the fourth gate and the sharing gate has a metal layer and a gate oxide layer formed between the metal layer and the fin structure.

15. The non-volatile memory of claim 14, wherein thicknesses of the metal layers of the first gate, the second gate, the third gate, the fourth gate and the sharing gate are the same, and thicknesses of the gate oxide layers of the first gate, the second gate, the third gate, the fourth gate and the sharing gate are the same.

16. The non-volatile memory of claim 1, wherein the sharing gate is a poly over diffusion edge (PODE) of the non-volatile memory.

17. A method for programming a memory array, comprising:

providing a memory array comprising a plurality of non-volatile memories each being the non-volatile memory type of claim 1;

providing a first voltage ranging from 0.6 volts to 1.4 volts to the first gates or the fourth gates of the non-volatile memories at a selected row of the memory array;

providing a second voltage ranging from 1.2 volts to 2.2 volts to the second gates and the third gates of the plurality of the non-volatile memories of the memory array;

providing a third voltage ranging from 3.6 volts to 5.5 volts to the sharing gates of the plurality of the non-volatile memories of the memory array; and providing a ground voltage to the first source regions of the non-volatile memories at a selected column of the memory array;

wherein the third voltage is greater than the first and the second voltages, and the first and second voltages are greater than the ground voltage.

18. The method of claim 17, further comprising:

providing the first voltage to the first source regions of the non-volatile memories at unselected columns of the memory array.

19. The method of claim 17, further comprising:

providing the ground voltage to the first gates and the fourth gates of the non-volatile memories at unselected rows of the memory array.

* * * * *